US006057727A

United States Patent [19]

Dautriche et al.

[11] Patent Number: 6,057,727

[45] Date of Patent: May 2, 2000

[54] ACCURATE CONSTANT CURRENT GENERATOR

[75] Inventors: Pierre Dautriche, Meylan; Thierry Rouzier, Grenoble, both of France

[73] Assignee: STMicroelectronics S.A., Gentilly, France

[21] Appl. No.: 09/175,000

[22] Filed: Oct. 19, 1998

[30] Foreign Application Priority Data

Oct. 20, 1997 [FR] France .................................. 97 13318

[51] Int. Cl.[7] ........................................................ G05F 1/10

[52] U.S. Cl. .......................... 327/543; 327/538; 327/540; 323/313; 323/315

[58] Field of Search ..................................... 327/538, 539, 327/540, 541, 543; 323/312, 313, 315

[56] References Cited

U.S. PATENT DOCUMENTS

| | | | |
|---|---|---|---|
| 4,626,702 | 12/1986 | Chito | 327/132 |
| 5,359,552 | 10/1994 | Dhong et al. | 327/539 |
| 5,642,072 | 6/1997 | Miyamoto et al. | 327/535 |
| 5,680,348 | 10/1997 | Chung et al. | 365/185.23 |
| 5,774,013 | 6/1998 | Groe | 327/543 |

FOREIGN PATENT DOCUMENTS 196 20 181 9/1997 Germany .

OTHER PUBLICATIONS

French Search Report for application No. 9713318, filed Oct. 20, 1997.

Current Sources and Sinks, Electronics World and Wireless World, vol. 96, No. 1658, Dec. 1, 1990 p. 1064 XP000174982.

*Primary Examiner*—Timothy P. Callahan
*Assistant Examiner*—An T. Luu
*Attorney, Agent, or Firm*—Wolf, Greenfield & Sacks, P.C.; James H. Morris; Theodore E. Galanthay

[57] ABSTRACT

The present invention relates to a constant current generator including a reference voltage source providing a constant voltage with respect to a first ground; an operational amplifier receiving the constant voltage on a non-inverting input; and a follower transistor controlled by the output of the operational amplifier and connected between an input of a current mirror and a first resistor connected to the first ground. It further includes a second resistor connected between an output of the current mirror and a second ground, the output of the current mirror being also coupled to an inverting input of the operational amplifier; and a filtering circuit connected to reduce or eliminate, in the output signal of the operational amplifier, any high frequency ac component with respect to the first ground.

4 Claims, 1 Drawing Sheet

ACCURATE CONSTANT CURRENT GENERATOR

BACKGROUND OF THE INVENTION

1. Field of the Invention

The present invention relates to an accurate current generator, providing a current which is stable with respect to temperature and to the manufacturing process of the generator.

2. Discussion of the Related Art

An accurate current generator is often used in a digital-to-analog converter providing a current output depending on the generator.

FIG. 1 shows a conventional accurate current generator. This generator includes an accurate current source 10, such as a "band-gap" source, which provides a constant voltage Vbg independent from the temperature and the manufacturing process. This constant voltage Vbg is applied to the non-inverting input of an operational amplifier 12 which controls a follower transistor MN1, generally an N-channel MOS transistor. The source of transistor MN1 is connected to the inverting input of operational amplifier 12 and supplies a resistor R connected to a ground GNDe.

With this configuration, the potential of the source of transistor MN1 is set to value Vbg provided by accurate source 10. Thus, a current determined by constant voltage Vbg and resistor R settles in transistor MN1. This current forms the generator output current. The output current is generally provided, as shown, to the input of a current mirror including two P-channel MOS transistors MP1 and MP2. The sources of transistors MP1 and MP2 are connected to a high supply potential Vdd. The gates of transistors MP1 and MP2 and the drain of transistor MP1 are connected to the drain of transistor MN1. With this configuration, the output current of the generator is copied on the drain of transistor MP2 and of any other transistor connected to transistor MP1 like transistor MP2.

The stability of the current provided by the generator (according to the temperature and the manufacturing process) depends on the stability of resistor R and of voltage Vbg. Band-gap source 10 provides a particularly stable voltage Vbg. However, the integrated resistors are not very stable. Thus, resistor R is most often external and connected, as shown, between an external terminal GNDe and an integrated circuit pin. The integrated portion of the current generator, especially band-gap source 10, is connected to an internal ground GNDi. Of course, this internal ground is connected to external ground GNDe by a pin of the integrated circuit, as shown.

However, the internal ground is not directly accessible from the outside, and the connection is generally performed through the integrated circuit substrate. This substrate and its connection to external ground GNDe have an impedance Z. The current generator is most of the time integrated with digital circuits which inject noise into the substrate. This noise Vn reappears across impedance Z.

Assuming that internal ground GNDi is at potential 0, external ground GNDe will be at potential −Vn, while the source of transistor MNI, regulated with respect to internal ground GNDi, is at reference potential Vbg. Accordingly, the voltage across resistor R is equal to Vbg+Vn, whereby the output current of the generator is equal to (Vbg+Vn)/R and includes a non-negligible noise component Vn/R.

The only way to filter out this noise is to connect a capacitor, as shown in dotted lines, between the gates of transistors MP1 and MP2 and internal ground GNDi. However, the gates of transistors MP1 and MP2 are at low impedance due to the diode connection of transistor MP1, which requires a filtering capacitor of high value and difficult to reasonably integrate.

To overcome this problem, it is provided in some applications to implement resistor R in integrated form. In the current provided by the generator, the contribution of noise Vn created between the internal and external grounds is thus eliminated. However, the resistor is then highly dependent on the temperature and the manufacturing process.

SUMMARY OF THE INVENTION

An object of the present invention is to provide a current generator which avoids these problems, that is, which provides a stable noiseless current without requiring a filtering capacitor of high value.

This and other objects are achieved by a constant current generator including a reference voltage source providing a constant voltage with respect to a first ground; an operational amplifier receiving the constant voltage on a non-inverting input; and a follower transistor controlled by the output of the operational amplifier and connected between an input of a current mirror and a first resistor connected to the first ground. It further includes a second resistor connected between an output of the current mirror and a second ground, the output of the current mirror being also coupled to an inverting input of the operational amplifier; and a filtering means connected to reduce or eliminate, in the output signal of the operational amplifier, any high frequency ac component with respect to the first ground.

According to an embodiment of the present invention, the filtering means includes a resistor connected between the output of the current mirror and the inverting input of the operational amplifier, and a capacitor connected between the inverting input and the first ground.

According to an embodiment of the present invention, the operational amplifier has a low bandwidth.

According to an embodiment of the present invention, the first ground is a ground internal to an integrated circuit including the current generator, and the second ground is an external ground connected to the internal ground through a pin of the integrated circuit, the second resistor being external.

The foregoing objects, features and advantages of the present invention, will be discussed in detail in the following non-limiting description of specific embodiments in connection with the accompanying drawings.

DETAILED DESCRIPTION

Figure 1:
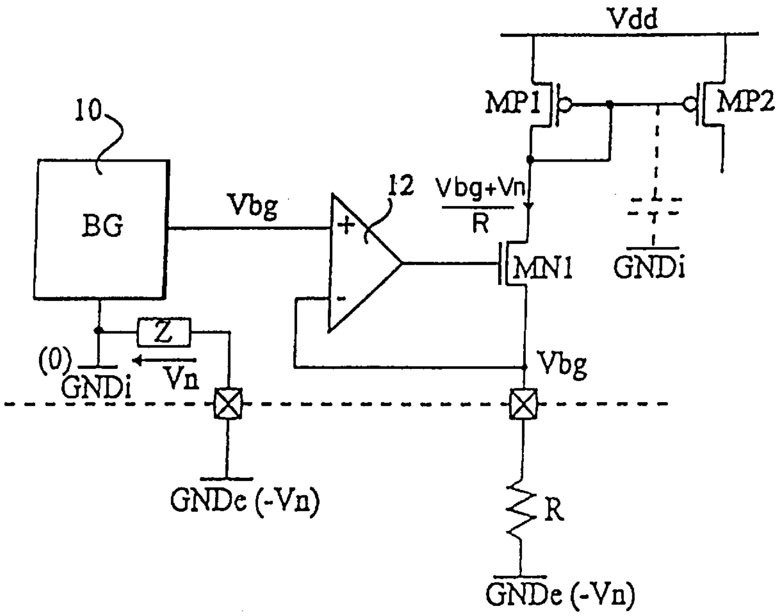
FIG. 1 (PRIOR ART)
FIG. 1, previously described, shows a conventional constant current generator.
Figure 2:
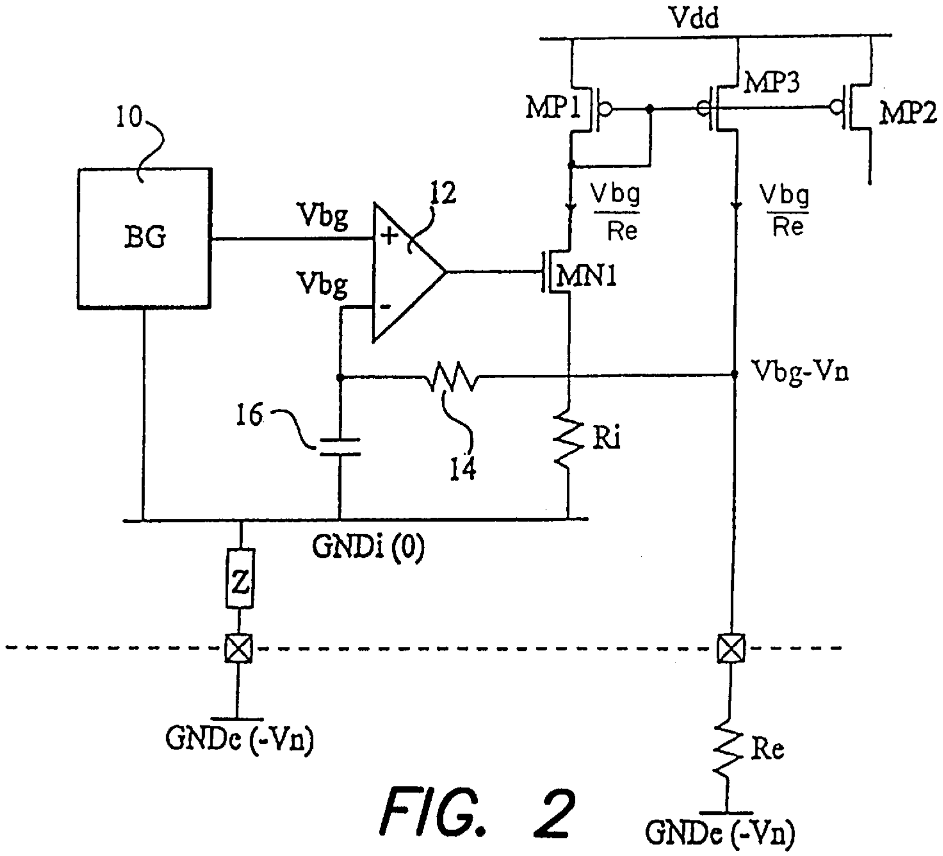
FIG. 2 shows an embodiment of a constant current generator according to the present invention.

The current generator of FIG. 2 includes the same elements as that of FIG. 1, designated by same references. According to the present invention, the source of transistor MN1 is connected to internal ground GNDi by an integrated internal resistor Ri, while current mirror MP1–MP2 comprises an additional P-channel transistor MP3, connected to transistor MP1 like transistor MP2. Transistor MP3 copies the output current of the generator on an external resistor Re connected to external ground GNDe. External resistor Re has the characteristics required to make the output current of the generator stable.

The connection node between resistor Re and transistor MP3 is connected to the inverting input of operational amplifier 12 by a low-pass filter which acts with respect to internal ground GNDi. As shown, this low-pass filter may be formed of a resistor 14 connected between resistor Re and the inverting input of amplifier 12, and of a capacitor 16 connected between the inverting input of amplifier 12 and internal ground GNDi. Given that the inputs of amplifier 12 are at high impedance, capacitor 16 can be of low value and resistor 14 of high value, which makes the filter easily integrable.

The filtering could also be implemented by a simple bandwidth limiting of amplifier 12. Of course, filter 14–16 could be used together with a bandwidth limiting of amplifier 12. The aim is to reduce or eliminate any high frequency component referenced to internal ground GNDi in the output signal of amplifier 12. This ensures the application of a noiseless voltage across internal resistor Ri. Thus, the current created in resistor Ri, which is also the output current of the generator, is noiseless. Of course, since resistor Ri is not stable with respect to the manufacturing process and to temperature, its current is normally likely to vary with temperature and to differ from one circuit to another. The function of external resistor Re is to ensure the current stability. This operation will be understood hereafter.

The voltages are referenced to internal ground GNDi. In steady state, it is assumed that the current provided by the generator is equal to Vbg/Re, where Vbg is the voltage provided by bandgap gap voltage source 10 and Re is the value of external resistor Re. Current Vbg/Re reappears in the drains of transistors MP1 and MP3 by current mirror effect. The voltage across resistor Re thus is equal to Vbg. Given that external ground GNDe is at potential −Vn, the connection node between resistor Re and transistor MP3 is at a potential Vbg−Vn. Filter 14–16 reduces or eliminates ac component Vn, whereby dc component Vbg appears on the inverting input of amplifier 12. The system thus is in a steady state, since the two inputs of amplifier 12 receive equal voltages, and it provides a noiseless current Vbg/Re depending on values (Vbg and Re) which are stable with respect to temperature and to the manufacturing process.

The state which has just been described effectively is the steady state. Indeed, if resistance Ri decreases, for example, due to temperature, the current in transistor MN1, and thus in transistor MP3, increases. This current increase causes an increase of the voltage across resistor Re and thus of the voltage on the inverting input of amplifier 12. Amplifier 12 reacts by decreasing its output voltage and thus the current in resistor Ri, this, until the voltage on the inverting input of amplifier 12 has become equal again to voltage Vbg on the non-inverting input.

Actually, the value of resistor Ri is not important, since the system reacts by adjusting the output voltage of amplifier 12 to obtain the adequate current Vbg/Re in resistor Ri. In practice, substantially equal resistors Ri and Re will be chosen.

The absence of noise in the output current of the generator is due to the fact that the current is generated by applying a noiseless voltage across internal resistor Ri. The noise which is likely to reach resistor Ri is reduced or eliminated upstream by filter 14–16. It could also be reduced or eliminated further downstream by limiting the bandwidth of amplifier 12 or by connecting a low-pass filter to the output of amplifier 12.

Of course, the present invention is likely to have various alterations, modifications, and improvements which will readily occur to those skilled in the art. In particular, the transistors, described as MOS transistors, can be replaced with bipolar transistors.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A constant current generator, including:

a reference voltage source providing a constant voltage with respect to a first ground;

an operational amplifier receiving the constant voltage on a non-inverting input;

a follower transistor controlled by the output of the operational amplifier and connected between an input of a current mirror and a first resistor connected to the first ground;

a second resistor connected between an output of the current mirror and a second ground, the output of the current mirror being also coupled to an inverting input of the operational amplifier; and a filtering means connected to reduce, in the output signal of the operational amplifier, any high frequency ac component with respect to the first ground.

2. The current generator of claim 1, wherein the filtering means includes a resistor connected between the output of the current mirror and the inverting input of the operational amplifier, and a capacitor connected between the inverting input and the first ground.

3. The current generator of claim 1, wherein the operational amplifier has a low bandwidth.

4. The current generator of claim 1, wherein the first ground is a ground internal to an integrated circuit including the current generator, and the second ground is an external ground connected to the internal ground through a pin of the integrated circuit, the second resistor being external.

* * * * *